United States Patent
Stevens

(10) Patent No.: US 7,920,663 B1
(45) Date of Patent: Apr. 5, 2011

(54) USING THE AC MAINS AS A REFERENCE FOR FREQUENCY COMPARISON

(75) Inventor: William M. Stevens, Oroville, WA (US)

(73) Assignee: Broadcom Corporation, Irvine, CA (US)

( * ) Notice: Subject to any disclaimer, the term of this patent is extended or adjusted under 35 U.S.C. 154(b) by 743 days.

(21) Appl. No.: 11/603,323

(22) Filed: Nov. 20, 2006

(51) Int. Cl.
*H04L 7/00* (2006.01)
*H03J 7/04* (2006.01)
*H03L 7/00* (2006.01)
*H03L 1/00* (2006.01)

(52) U.S. Cl. ........ 375/354; 713/400; 713/500; 713/501; 713/502; 713/503; 331/1 R; 331/16; 331/176; 331/177 R

(58) Field of Classification Search ............... 455/226.1, 455/522.1; 375/371–375, 354; 368/46, 47; 331/1 R, 16, 176, 177 R
See application file for complete search history.

(56) References Cited

U.S. PATENT DOCUMENTS

| | | | | |
|---|---|---|---|---|
| 5,805,530 | A * | 9/1998 | Youngberg | 368/47 |
| 6,639,957 | B2 * | 10/2003 | Cahill-O'Brien et al. | 375/354 |
| 6,973,400 | B2 * | 12/2005 | Cahill-O'Brien et al. | 702/106 |
| 7,373,124 | B2 * | 5/2008 | Okanobu | 455/226.1 |
| 2004/0165480 | A1 * | 8/2004 | Shemesh et al. | 368/46 |
| 2005/0085259 | A1 * | 4/2005 | Conner et al. | 455/552.1 |
| 2007/0090883 | A1 * | 4/2007 | Yang et al. | 331/16 |

* cited by examiner

*Primary Examiner* — Chieh M Fan
*Assistant Examiner* — Eboni Giles
(74) *Attorney, Agent, or Firm* — McAndrews, Held & Malloy, Ltd.

(57) ABSTRACT

Adjusting a local frequency source is disclosed. A local frequency comparison data is compared with a received frequency comparison data, wherein the local frequency comparison data reflects a difference, if any, between a locally measured AC frequency and a frequency generated using the local frequency source. The local frequency source is adjusted based at least in part on a result of the comparison.

36 Claims, 7 Drawing Sheets

USING THE AC MAINS AS A REFERENCE FOR FREQUENCY COMPARISON

BACKGROUND OF THE INVENTION

A precise and stable reference frequency is often desired, e.g., in a communication device required, by standard, regulation, or otherwise, to transmit at a specified frequency within a prescribed tolerance. For example, ETSI GSM Standard 05.10 specifies that the GSM air interface requires a frequency stability of ±0.1 ppm, and not meeting this specification at a base transceiver station (BTS) site can lead to dropped calls and other problems. A precise and stable reference frequency has been achieved through high-precision and high-stability reference oscillators, but these reference oscillators are exceedingly bulky, power inefficient, and/or expensive for many communication devices that require a precise and stable reference frequency. Global Positioning System (GPS) disciplined oscillators have also been used to provide reference frequencies, but GPS requires an unobstructed view of the sky, which may not be available to a communications or other equipment located in an interior office or apartment. Even if an unobstructed view of the sky is available, GPS is expensive and difficult to install. Therefore, there exists a need for an alternative way to provide a precise and stable reference frequency.

BRIEF DESCRIPTION OF THE DRAWINGS

Various embodiments of the invention are disclosed in the following detailed description and the accompanying drawings.

DETAILED DESCRIPTION

Figure 1:
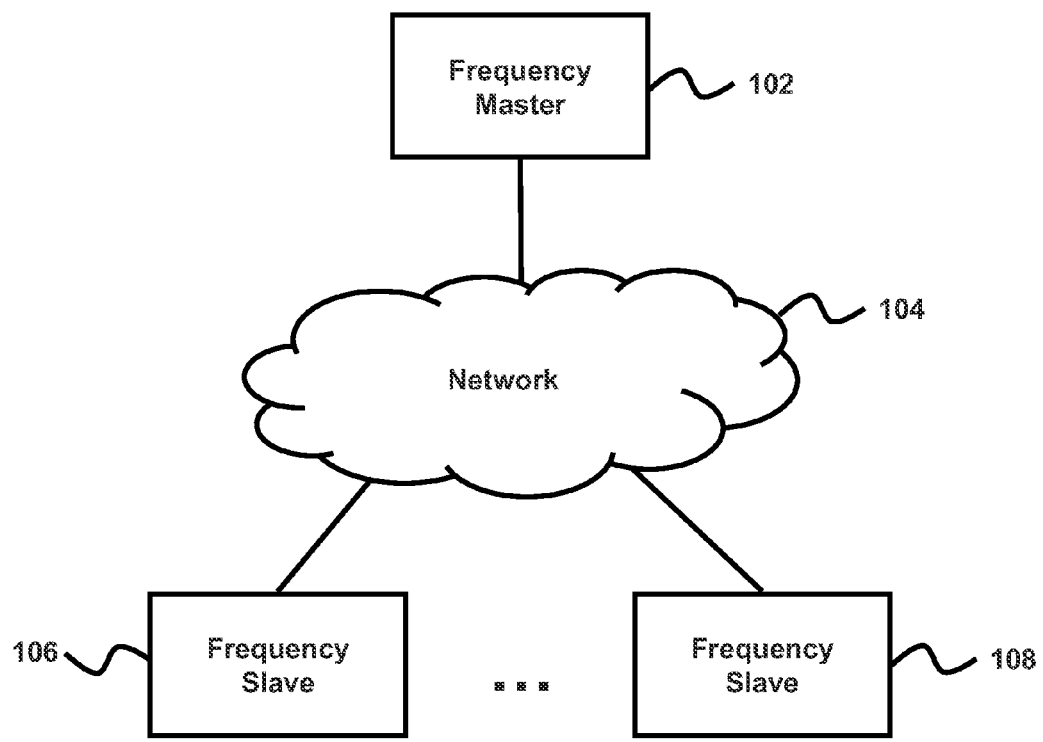
FIG. 1 is a block diagram illustrating an embodiment of a frequency synchronization environment.

The invention can be implemented in numerous ways, including as a process, an apparatus, a system, a composition of matter, a computer readable medium such as a computer readable storage medium or a computer network wherein program instructions are sent over optical or communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Since the frequency and period of a signal are interrelated by the equation, Frequency=1/Period, the term, frequency, as used herein can refer to either or both frequency and period. Frequency synchronization is described. AC mains (e.g., public electric utility grid) deliver alternating current (AC) to electrical outlets. The ideal representation of the electrical current from AC mains is a sinusoid with a single frequency component. Due to power transmission and distribution issues, electrical current from AC mains exhibit harmonic distortion, impulse noise, amplitude variation, frequency variation, and other distortions and variations, potentially rendering the AC mains an insufficiently stable signal to be used itself as a reference frequency. However, the frequency at different points on the same power distribution area (grid) must be maintained within a level of precision across the grid to prevent generator shutdown and other problems. For example, in the U.S. power is distributed primarily on three grids, one in East, one in the West, and a third in Texas. At any two points on any one of these grids, the frequency at any moment is required and has been observed to be highly correlated. Since the observed frequency of the AC mains at any instant in time is highly correlated across the entire power distribution area, differential correction can be used to align frequencies of local oscillators across the power distribution area. Aligning the frequencies includes adjusting the frequencies of the local oscillators to be within a tolerance from a reference frequency value. A master station provides to a slave, e.g., in a remote geographic location, a comparison between a master reference frequency and a observed AC mains frequency at a specified point in time. The slave compares the provided frequency comparison data with a corresponding locally determined frequency comparison data to adjust a local oscillator of the slave. The local frequency comparison data is generated by comparing a locally observed AC mains frequency and a frequency generated using the local oscillator.

FIG. 1 is a block diagram illustrating an embodiment of a frequency synchronization environment. Frequency master 102 is connected to frequency slave 106 and frequency slave 108 through network 104. Frequency master 102 provides frequency synchronization data to frequency slave 106 and frequency slave 108. For example, frequency comparison data associated with a master reference frequency and observed AC mains frequency is provided to slaves 106 and 108. Each slave uses the comparison data to align a local oscillator with the master reference frequency. Frequency master 102, frequency slave 106, and frequency slave 108 are associated with a single power distribution area that maintains the frequency of the AC mains within a tolerance level across the entire distribution area. For example, frequency master 102, frequency slave 106, and frequency slave 108 have access to AC power from the same public utility power grid. There may exist any number of frequency slaves associated with frequency master 102. One or more other frequency masters may exist. In some embodiments, frequency master 102 is included in a mobile communication network infrastructure, and each frequency slave is associated with a wireless communication equipment, such as a base transceiver station (BTS). Network 104 comprises a public or private network and/or combination thereof, for example an Ethernet, serial/parallel bus, intranet, Internet, LAN, WAN, power-line, and other forms of connecting multiple systems and/or groups of systems together. In some embodiments, data between frequency master 102 and frequency slaves 106 and 108 is communicated using data packets. In some embodiments, time is synchronized between frequency master 102, frequency slave 106, and frequency slave 108 through network 104. For example, network time protocol (NTP) is used to exchange and synchronize time.

Figure 2:
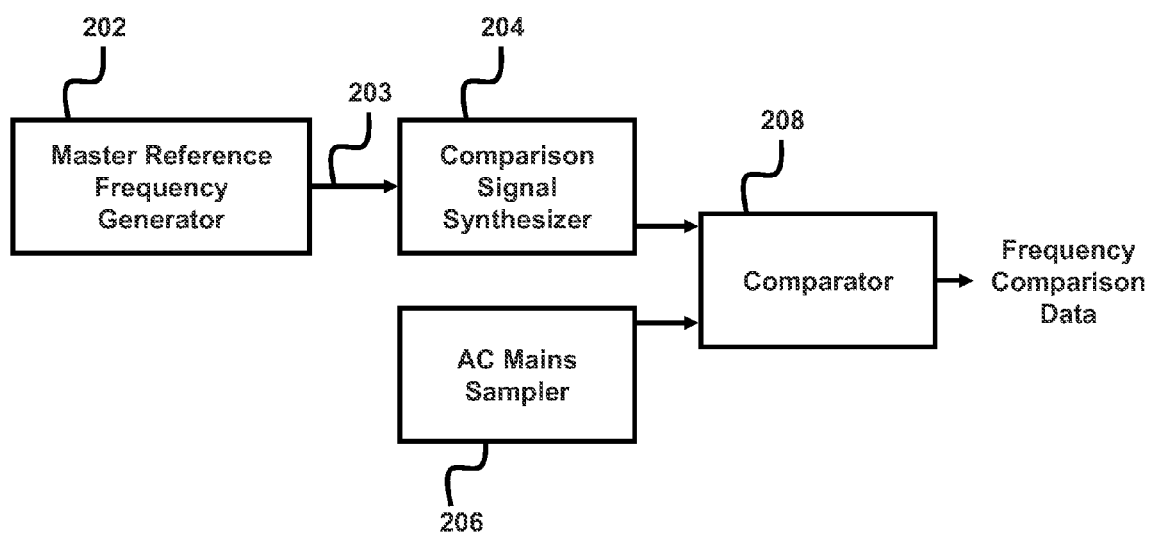
FIG. 2 is a block diagram illustrating an embodiment of a frequency master.

FIG. 2 is a block diagram illustrating an embodiment of a frequency master. In some embodiments, frequency master 102 of FIG. 1 includes components of FIG. 2. Master reference frequency generator 202 includes one or more components capable of generating a precise and stable reference frequency. Examples of the master reference frequency generator components include a standalone atomic clock (e.g. Rubidium or Cesium based), a GPS disciplined oscillator, and other common sources of high accuracy and stability time references (e.g. Stratum 1 network timing). Using a reference frequency 203 generated by generator 202, comparison signal synthesizer 204 synthesizes a signal to be used for comparison with an AC frequency. For example, if the AC mains target frequency is 60 Hz, synthesizer 204 generates a 60 Hz frequency by multiplying or dividing frequency output 203 of generator 202. AC mains sampler 206 obtains data that can be used to determine the frequency of the AC mains. For example, a sample of the waveform provided from an AC wall outlet is obtained. Comparator 208 compares the obtained data of sampler 206 with a corresponding frequency of synthesizer 204 output. The result of the comparison is outputted as frequency comparison data.

In some embodiments, the frequency comparison data includes data associated with a comparison between the obtained information of sampler 206 and the frequency of synthesizer 204. In some embodiments, the frequency comparison data includes a frequency value of the obtained frequency and/or the corresponding frequency value of synthesizer 204 output. In some embodiments, the frequency comparison data is associated with a time value. The time value is used in some embodiments at a remote (e.g., slave) location to determine when the comparison of comparator 208 was performed and/or when sampler 206 obtains the AC information. In various embodiments, the time value is determined using a synchronized clock. Example of the synchronized clock includes a clock synchronized using one or more of the following: NTP, a time server, GPS, and any other ways of synchronizing time. The frequency comparison data is obtained by one or more frequency slaves such as frequency slaves 106 and 108 of FIG. 1. The example shown in the figure has been simplified to illustrate the example clearly. In various embodiments, other filters and/or signal processing components may exist in the frequency master.

Figure 3:
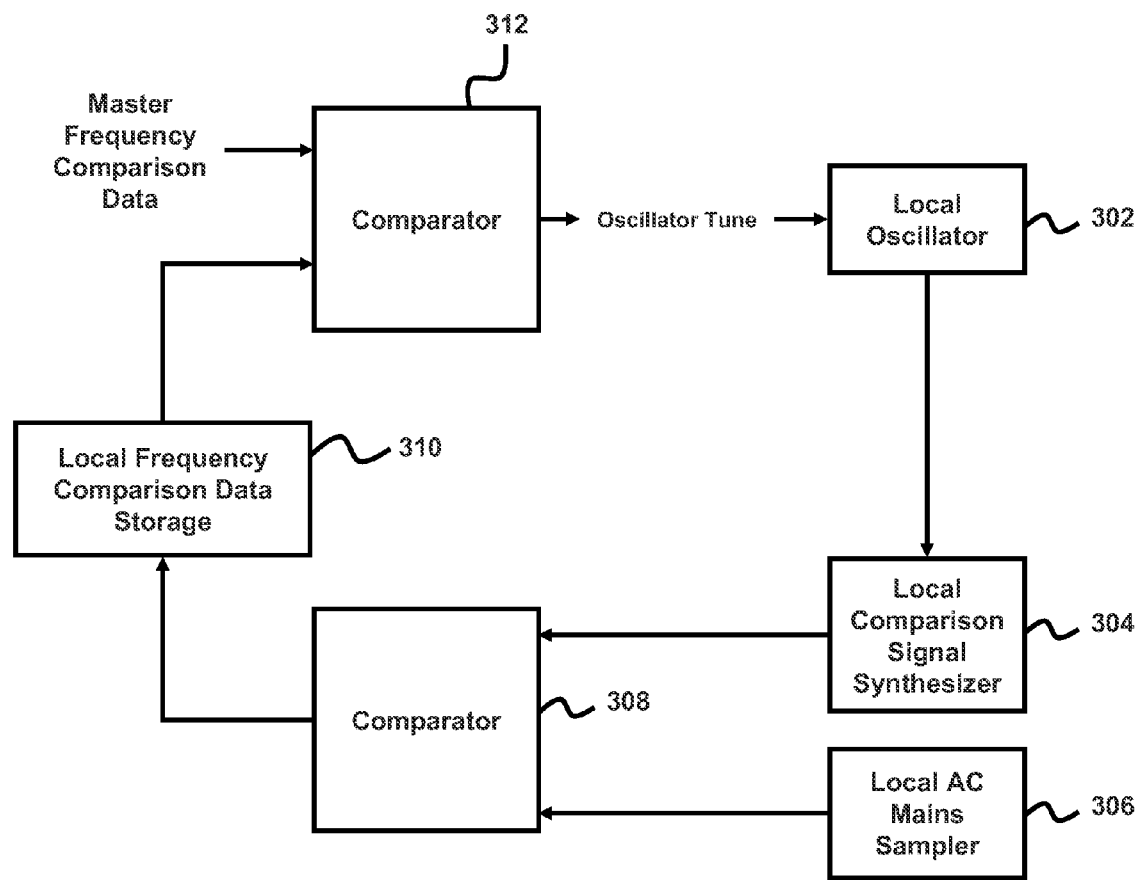
FIG. 3 is block diagram illustrating an embodiment of a frequency slave.

FIG. 3 is block diagram illustrating an embodiment of a frequency slave. In some embodiments, frequency slave 106 and/or 108 of FIG. 1 includes components of FIG. 3. In some embodiments, local oscillator 302 is used in mixing radio signals. Local oscillator 302 generates a local oscillator frequency. Examples of local reference oscillator 302 include a quartz or other crystal oscillator, which may be embodied in a variety of configurations, including voltage controlled oscillator (VCO), temperature compensated voltage controlled oscillator (TCVCXO or alternately VCTCXO), and ovenized voltage controlled oscillator (OCXO or alternately OCVCXO). In various embodiments, local reference oscillator 302 offers an advantage (e.g., cost, form factor, power requirement, etc.) over master reference frequency generator 202 of FIG. 2. Local reference oscillator 302 is adjusted to ensure its stability and/or accuracy. In some embodiments, if local reference oscillator 302 has not been adjusted for a predetermined time, an indication signal is generated. Using local oscillator 302, local comparison signal synthesizer 304 synthesizes a frequency that can be used for comparison with an AC frequency. When oscillator 302 is producing a frequency matching the master reference frequency of generator 202 of FIG. 2, the synthesized frequency of synthesizer 304 matches synthesized frequency of synthesizer 204 of FIG. 2. Local AC mains sampler 306 obtains information of the AC mains as observed locally at the frequency slave. For example, a sample of the waveform provided from a local AC wall outlet is obtained. Comparator 308 compares the obtained information of sampler 306 with a corresponding frequency of the output of synthesizer 304. The result of the comparison is outputted as local frequency comparison data and stored in local frequency difference storage 310. In some embodiments, the local frequency comparison data includes a value associated with the difference between the obtained information of sampler 306 and the corresponding frequency of the output of synthesizer 304. Comparator 312 compares master frequency comparison data with a corresponding local frequency comparison data stored in storage 310. In some embodiments, the master frequency comparison data includes frequency comparison data output of comparator 208 of FIG. 2 that has been received by the frequency slave through a network.

In some embodiments, the stored local frequency comparison data is associated with a time value. The time value is used match the master frequency comparison data to a corresponding local frequency comparison data. For example, a time value associated with the master frequency comparison data is matched with the time value of a local frequency comparison data. In some embodiments, the time value is used to determine when a comparison was performed by comparator 308 and/or when the local AC information was obtained to produce the local frequency comparison data. In various embodiments, the time value is determined using a clock synchronized with a clock of a frequency master, such as frequency master 102 of FIG. 1. In various embodiments a local clock is synchronized with a clock of a time master using one or more of the following: NTP, a time server, and any other ways of synchronizing time. The comparison result of comparator 312 is at least in part used to tune/adjust, if needed, local oscillator 302. In some embodiments, once local oscillator 302 is tuned, a predetermined amount of time must be passed before local oscillator 302 can be tuned again. For example, the wait time allows the new tuned frequency of the local oscillator to be propagated to one or more other frequency synchronization components. The example shown in the figure has been simplified to illustrate the example clearly. In various embodiments, other filters and/or signal processing components may exist in the frequency slave.

Figure 4:
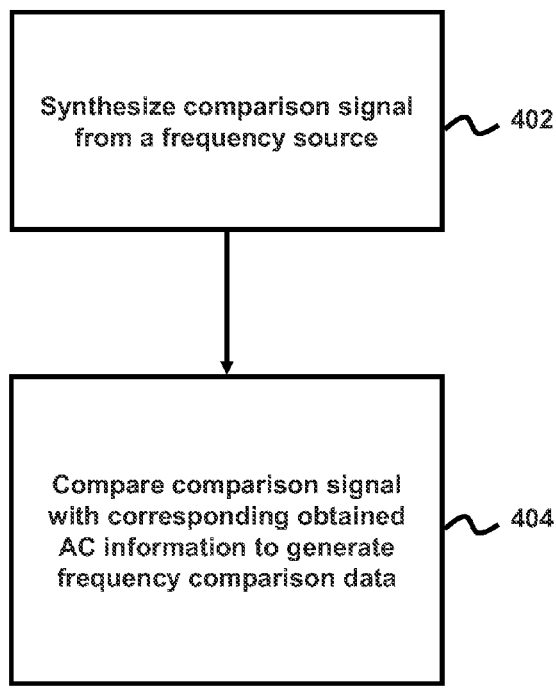
FIG. 4 is a flowchart illustrating an embodiment of a process for generating frequency comparison data.

FIG. 4 is a flowchart illustrating an embodiment of a process for generating frequency comparison data. The process may be implemented on frequency master 102 of FIG. 1. At 402, comparison signal is synthesized using a reference frequency. In some embodiments, the reference frequency is generated by master reference frequency generator 202 of FIG. 2, and the comparison signal is synthesized by synthesizer 204 of FIG. 2. At 404, the synthesized comparison signal is compared with a corresponding obtained AC information to generate frequency comparison data. In some embodiments, the comparison of 404 is at least in part performed using comparator 208 of FIG. 2. In some embodiments, comparing the frequencies includes aligning the phase of the two signals before comparing the frequencies. In some embodiments, the frequency comparison data includes a time when the obtained AC information was obtained. In various embodiments, the process of FIG. 4 is repeated at a periodic interval, a specified time, and/or in response to an indication.

Figure 5:
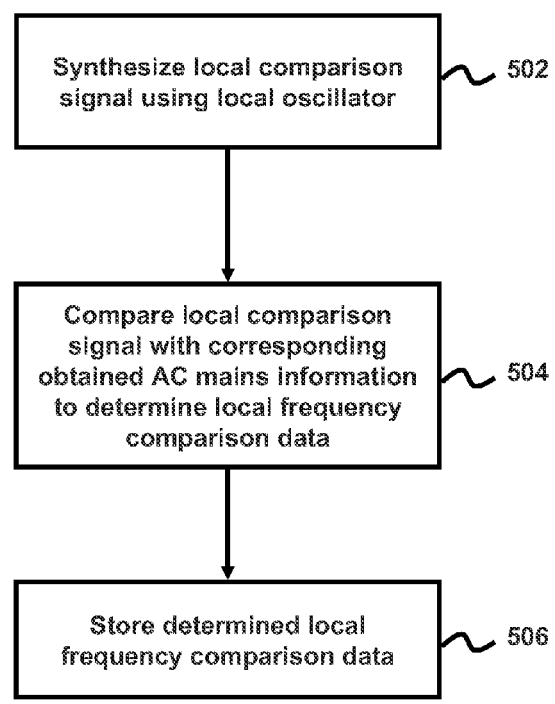
FIG. 5 is a flowchart illustrating an embodiment of a process for generating and storing local frequency comparison data.

FIG. 5 is a flowchart illustrating an embodiment of a process for generating and storing local frequency comparison data. The process may be implemented on frequency slave 106 and/or 108 of FIG. 1. At 502, a local comparison signal is synthesized using a local oscillator. In some embodiments, the local comparison signal is synthesized using synthesizer 304 of FIG. 3 by multiplying and/or dividing the frequency of local oscillator 302 of FIG. 3. At 504, the synthesized comparison signal is compared with a corresponding locally obtained information of the AC mains to generate local frequency comparison data. For example, the synthesized comparison signal is compared with a corresponding locally obtained sample of the AC mains waveform to generate local frequency comparison data. In some embodiments, the comparison of 504 is at least in part performed using comparator 308 of FIG. 3. In some embodiments, comparing the frequencies includes aligning the phase of the two signals before comparing the frequencies. At 506, the determined local frequency comparison data is stored. In various embodiments, the stored local frequency comparison data includes a value that can be used to match a corresponding master comparison signal data with the stored local frequency comparison data. In various embodiments, the process of FIG. 5 is repeated at a periodic interval, a specified time, and/or in response to an indication. In some embodiments, the process of FIG. 5 is repeated at a periodicity associated with a periodicity with which the process of FIG. 4 is repeated.

Figure 6:
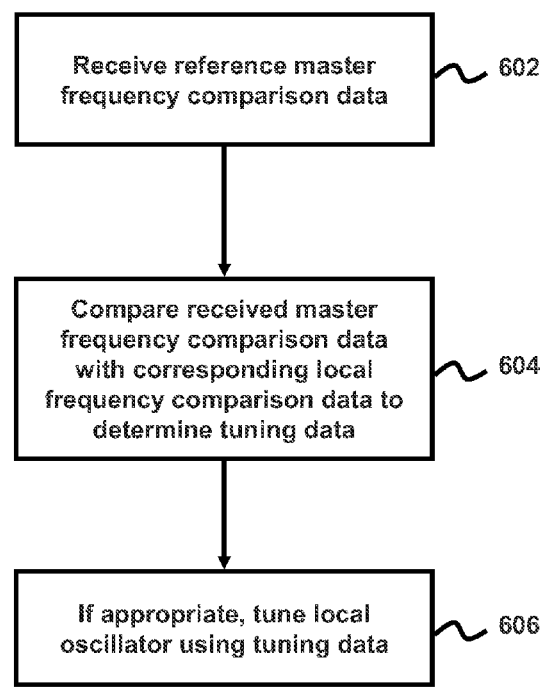
FIG. 6 is a flowchart illustrating an embodiment of a process for tuning a local reference oscillator.

FIG. 6 is a flowchart illustrating an embodiment of a process for tuning a local reference oscillator. The process may be implemented on frequency slave 106 and/or 108 of FIG. 1. At 602, master frequency comparison data is received. In some embodiments, the received master frequency comparison data includes frequency comparison data output of comparator 208 of FIG. 2. At 604, the received master frequency comparison data is compared with corresponding local frequency comparison data to determine tuning data. In some embodiments, the corresponding local frequency comparison data is a previously saved local frequency comparison data. For example, a time value associated with the received master frequency comparison data is matched with a corresponding local frequency comparison data stored in a memory or other storage, such as storage 310 of FIG. 3. If the corresponding local frequency comparison data cannot be determined, the process of FIG. 6 is aborted and/or delayed. In some embodiments, the comparison of 604 is performed using comparator 312 of FIG. 3. The amount of difference between the received master frequency comparison data and the corresponding local frequency comparison data corresponds with the amount of the difference between the frequency of a local oscillator and a master reference frequency at the time the information used to determine the master and local frequency comparison data were obtained. To align the local oscillator to the master reference frequency, the local oscillator is adjusted in some embodiments based at least in part on the amount of difference between the received master frequency comparison data and the corresponding local frequency comparison data. Determining the tuning data includes determining the tuning amount. In some embodiments, the mapping between a given frequency comparison data difference amount and the tuning amount is predetermined. In some embodiments, for a given frequency comparison data difference, the tuning amount is determined dynamically. For example, the oscillator tuning amount is adjusted based at least in part on temperature and/or time/age of the local oscillator. In some embodiments, the tuning amount is associated with a predetermined maximum tuning amount. For example, by limiting the tuning amount for a single tuning instance, over-correction is prevented. In some embodiments, the difference between the master frequency comparison data and the local frequency comparison data is provided as a feedback signal to a feedback loop, such as a frequency locked loop, configured to adjust the local oscillator in response to the feedback. In some embodiments, the raw difference is filtered and/or otherwise processed and/or converted prior to being provided as a feedback signal to the local oscillator, e.g., as a control voltage in the case of a voltage controlled oscillator (VCO).

At 606, if appropriate, local oscillator is tuned using the tuning data. In some embodiments, the local oscillator is local oscillator 302 of FIG. 3. The tuning data may indicate the local oscillator does not need to be tuned. In some cases, the local oscillator is not tuned if the local reference oscillator is associated with a state that indicates the local oscillator should not be tuned. Tuning the local oscillator includes adjusting the output frequency of the local oscillator. In some embodiments, after the local oscillator is tuned, a predetermined amount of time must pass before the local oscillator can be tuned again. In various embodiments, the process of FIG. 6 is repeated when a new master reference frequency comparison data is received. In various embodiments, the process of FIG. 6 is repeated at a periodic interval, a specified time, and/or in response to an indication.

In some embodiments, it determined whether frequency deviations across time measured at the slave is correlated with frequency deviations across time measured at the master. For example, if the frequency slave is not obtaining power from the same public utility grid as the frequency master the frequency deviations are not correlated in time. When it is detected the frequency deviations are not correlated in time, an error signal is generated and/or the process of FIG. 6 is aborted and/or delayed.

Figure 7:
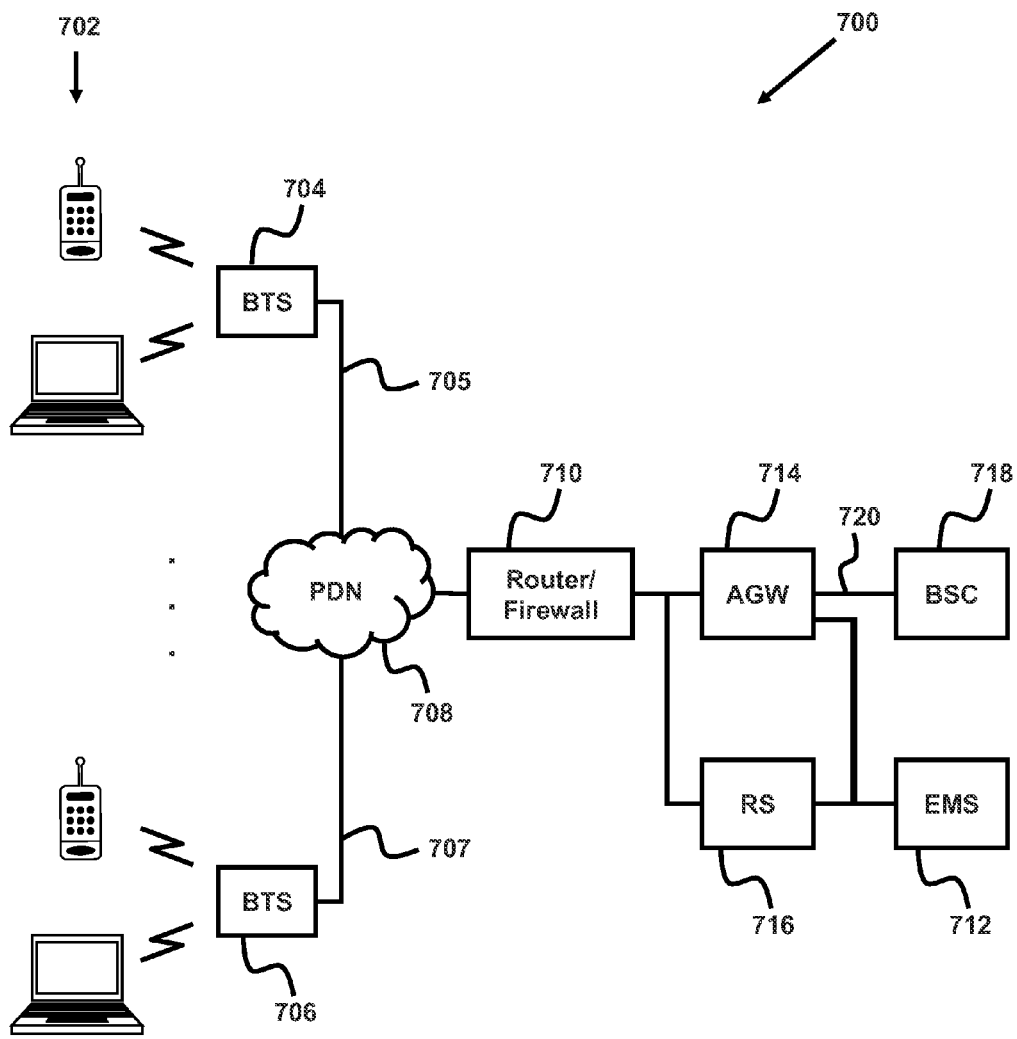
FIG. 7 is a block diagram illustrating an embodiment of a mobile network with packet data network backhaul.

FIG. 7 is a block diagram illustrating an embodiment of a mobile network with packet data network backhaul. In the example shown, the mobile network 700 includes mobile equipment 702 connected to a plurality of base transceiver stations represented in FIG. 7 by BTS 704 and BTS 706. BTS 704 and BTS 706 are connected via a local Internet access connection 705 and 707, respectively, to a packet data network (PDN) 708, such as the Internet. In some embodiments, PDN 708 includes network 104 of FIG. 1. In some embodiments, mobile network data is sent, via PDN 708, between the base transceiver stations represented by BTS 704 and BTS 706, on the one hand, and AGW 714, on the other, using the Internet (IP) protocol. In various embodiments, Internet access connections 705 and 707 comprise a cable, DSL, or other modem collocated with the BTS and/or a local exchange carrier central office (LEC-CO) with DSLAM or cable head-end. Also connected to PDN 708 in the example shown in FIG. 7 is a router/firewall 710 connected to and configured to provide connectivity to and security with respect to an aggregation gateway 714, and a registration server 716. In some embodiments, element management server EMS 712 is connected to router/firewall 710. In some embodiments, router/firewall 710 is omitted and/or does not include a firewall. In various embodiments, element management server 712, an aggregation gateway 714, and a registration server 716 are included in one or more physical computing systems. Element management server 712 enables an administrator to perform operational, administrative, and/or management (OAM) operations with respect to one or more mobile network elements, e.g., BTS 704 or BTS 706. Aggregation gateway (AGW) 714 receives inbound mobile network data (voice, signaling, data, control/management) from one or more base transceiver stations (BTS), via PDN 708, aggregates data from two or more base transceiver stations (if/as applicable), and provides the inbound data to BSC 718 via one or more physical ports, using time division multiplex (TDM) as prescribed by the GSM standard and the BSC OEM's proprietary implementation of the Abis interface 720. In some embodiments, the AGW 714 is capable of interfacing with more than one type of BSC, e.g., with BSC's from two or more vendors. In some such embodiments, the AGW 714 is configured and/or provisioned, e.g., at deployment time, to use the Abis interface API of the particular type of BSC with which it is required to communicate in a particular installation. In some embodiments, an API or other interface specification or definition of the Abis interface as implemented by each BSC vendor/OEM the AGW is desired to be able to support is obtained and used as applicable to configure/provision the AGW to communicate with a particular BSC with which it is required to communicate. In some embodiments, BSC 718 is connected to a PCU, such as PCU 112 of FIG. 1. In some embodiments, AGW 714 is connected to a PCU. For example, BSC 718 is optional, and AGW 714 directly connected to a PCU.

In some embodiments, AGW 714 is configured to present two or more physical base transceiver stations to the BSC as a single logical BTS, to more efficiently use BSC resources in situations in which each BTS serves a relatively small service area and/or number of users. In some embodiments, AGW 714 is configured to map communications received from the BSC to the correct physical BTS and conversely to map communications received from two or more physical base transceiver stations to a single logical BTS prior to forwarding such inbound communications to the BSC.

Registration server 716 is configured to be used to register a BTS and/or other provider equipment with the network, e.g., to authenticate the equipment prior to providing to the equipment session keys to be used in secure communication protocols, identifying (e.g., address) information for other network elements, such as AGW 714, etc. In some embodiments, a physical device, similar to a SIM or other smart card, referred to herein as an equipment identification module (EIM), is provided and installed on a first mobile network equipment, such as a BTS, e.g., at provisioning/configuration time. A secret embodied in the EIM is known to a second equipment associated with the mobile network, e.g., the registration server or other system with which the first mobile network equipment is configured to authenticate itself as part of a registration or similar process, and the first and second equipment use the shared secret to mutually authenticate. Once the first and second equipment have mutually authenticated, in some embodiments the second equipment (e.g., registration server 716) generates and sends to the first equipment via a secure connection a set of keys to be used to send call data securely over the packet data network.

Each BTS in the mobile network 700 shown in FIG. 7 in some embodiments handles only a small fraction of the call volume/load of a conventional BTS, and in such embodiments AGW 714 promotes more efficient use of limited BSC resources. For example, in some embodiments AGW 714 aggregates data associated with multiple base transceiver stations and provides communication to/from the BSC via a fewer number of physical BSC ports (e.g., a single port). In various embodiments, use of PDN 708 and AGW 714 to transport data between base transceiver stations such as BTS 704 and BTS 706, on the one hand, and BSC 718, on the other, makes it commercially feasible to provide a small from factor and/or relatively low capacity BTS for use in remote (e.g., rural) service areas and/or to provide dedicated service to individuals and/or relatively small groups of users, such as a household or small business, since in addition to not requiring a BSC port for each BTS a dedicated T-1/E-1 line is not required.

While the example shown in FIG. 7 and in other embodiments described herein involves a GSM network and/or uses GSM nomenclature to refer to network elements, the techniques described herein are applied in other embodiments to other types of mobile telecommunications networks, and in particular may be applied wherever a plurality of relatively low capacity base transceiver stations need to exchange mobile communication data with a base station controller or other node having a limited number of relatively very high capacity ports or other resources.

Without limiting the generality of the foregoing, the Universal Mobile Telecommunications System (UMTS) is one example of another type of mobile telecommunications network in which the techniques disclosed herein may be applied. In a UMTS network, a W-CDMA air interface (the Uu interface) replaces the GSM air interface shown in FIG. 7. In UMTS, a mobile user employs a user equipment (UE) to communicate via the air (Uu) interface with a base transceiver called a "node B" in UMTS nomenclature, which in some embodiments would replace the BTS 704 and BTS 706 in FIG. 7 for a UMTS implementation. In such an embodiment, a node B (base transceiver) communicates via a packet-based network (e.g., IP network) with the AGW, which aggregates data associated with multiple nodes B and communicates via a third party/proprietary implementation of an interface to a radio network controller (RNC), the Iub interface, which is the equivalent in a UMTS network to a GSM base station controller (BSC), such as BSC 718 of FIG. 7. As used herein, unless specified otherwise, the term "base transceiver station" is used generically to refer to a transceiver and/or associated equipment configured to communicate with a mobile (e.g., user) equipment via an air interface to provide connectivity between the mobile equipment and other elements (e.g., a terrestrial portion) of a radio access network, and includes without limitation a GSM BTS and a UMTS node B. Likewise, as used herein, unless specified otherwise, the term "base station controller" is used generically to refer to a controller configured to connect one or more base transceiver stations to a core mobile network, and includes without limitation a GSM BSC and a UMTS RNC.

In some embodiments, a frequency slave (e.g., frequency slave 106 and 108 of FIG. 1, frequency slave of FIG. 3) is included BTS 704 and/or BTS 706. For example, a local oscillator used for mobile communication by BTS 704 and/or BTS 706 is adjusted using a frequency master. In some embodiments, a frequency master (e.g., frequency master 102 of FIG. 1, frequency master of FIG. 2) is included in router 710, AGW 714, BSC 718, RS 716, EMS 712, or any other mobile network service provider component/equipment. In some embodiments, a frequency master is connected to PDN 708 as a stand-alone node.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of adjusting a local frequency source, comprising:
receiving first frequency comparison data at a second device from a first device via a packet data network, the first device comprising a first frequency source and a first AC mains sampler, the first frequency comparison data comparing a first frequency of the first frequency source and a second frequency from the first AC mains sampler;
comparing, at the second device, a second frequency comparison data and the received first frequency comparison data, the second device comprising a second frequency source and a second AC mains sampler, the second frequency comparison data being generated from comparing a third frequency of the second frequency source and a fourth frequency of the second AC mains sampler; and
adjusting the third frequency of the second frequency source based, at least in part, on the comparison of the second frequency comparison data and the received first frequency comparison data, wherein adjusting includes aligning the third frequency of the second frequency source to the first frequency of the first frequency source associated with the received first frequency comparison data.

2. The method according to claim 1, wherein the first AC mains sampler and the second AC mains sampler sample different AC outlets, and wherein frequency deviations detected from the different AC outlets at the first device and the second device are correlated in time.

3. The method according to claim 1, wherein AC information sampled at the first device and at the second device is associated with a frequency that is maintained within a tolerance across a distribution area.

4. The method according to claim 1, wherein AC information includes a measured AC frequency of electricity provided by a public electric utility grid.

5. The method according to claim 1, wherein the third frequency of the second frequency source of the second device is used in radio communication with a GSM handset.

6. The method according to claim 1, wherein the third frequency of the second frequency source of the second device is used in cellular communication with a GSM handset, and wherein the second device is part of a Base Transceiver Station (BTS).

7. The method according to claim 6, wherein the Base Transceiver Station and another Base Transceiver Station communicates with an aggregation gateway via the Internet, and wherein the aggregation gateway presents the Base Transceiver Station and the another Base Transceiver Station as a single logical Base Transceiver Station to a base station controller (BSC) over a single BSC port and a dedicated line between the single BSC port and the aggregation gateway.

8. The method according to claim 1, wherein the first frequency comparison data is received via the packet data network in a mobile cellular communications network from a base station controller associated with the first frequency, and wherein the second device is part of the base station controller.

9. The method according to claim 1, wherein comparing the second frequency comparison data and the received first frequency comparison data includes matching a time associated with the received first frequency comparison data to the second frequency comparison data associated with the same time.

10. The method according to claim 9, wherein a time identifier associated with the second frequency comparison data is used to determine when AC information was obtained by the second AC mains sampler.

11. The method according to claim 1, wherein the second frequency comparison data includes an identifier determined using a local clock that is synchronized with a remote clock associated with a location with which the received first frequency comparison data is associated.

12. The method according to claim 1, wherein the Network Timing Protocol is used to synchronize the local clock with the remote clock.

13. The method according to claim 1, wherein the third frequency generated using the second frequency source is generated, at least in part, by multiplying or dividing a local oscillator frequency of a reference frequency source of the second device.

14. The method according to claim 1, wherein the second frequency comparison data includes one or more of the following: a computed difference between the third frequency of the second frequency source and the fourth frequency of the second AC mains sampler, at least a portion of AC information obtained by the second AC mains sampler, and the third frequency generated using the second frequency source.

15. The method according to claim 1, wherein adjusting the third frequency of the second frequency source includes adjusting the third frequency of the second frequency source to enhance one or more of the following: frequency stability and frequency accuracy.

16. The method according to claim 1, wherein if the third frequency of the second frequency source has not been adjusted for a predetermined amount of time, an indication is generated.

17. The method according to claim 1, wherein once the third frequency of the second frequency source is adjusted, a predetermined amount of time passes before the local frequency source can be adjusted again.

18. The method according to claim 1, wherein the second frequency comparison data includes stored data previously stored in the second device and located using an identifier included in the first frequency comparison data received from the first device.

19. The method according to claim 1, wherein the comparison of the second frequency comparison data and the received first frequency comparison data includes a value associated with the amount of the difference between the first frequency of the first frequency source and the third frequency of the second frequency source.

20. The method according to claim 1, wherein the adjusting of the third frequency of the second frequency source includes adjusting the third frequency of the second frequency source based, at least in part, on a dynamically determined mapping between the result of the comparison of the second frequency comparison data and the received first frequency comparison data and a tuning amount.

21. The method according to claim 20, wherein the tuning amount is not greater than a predetermined maximum tuning amount to reduce over correction.

22. The method according to claim 1, wherein if the result of the comparison of the second frequency comparison data and the received first frequency comparison data indicates that the second frequency source does not need to be adjusted, then the local frequency source is not adjusted.

23. A method of providing a frequency reference, comprising:
determining, in a base station controller, first frequency comparison data by comparing first AC mains information from a first AC mains sampler of the base station controller and a comparison signal generated using a reference frequency source of the base station controller; and providing the first frequency comparison data to a base transceiver station of a GSM or UMTS mobile communications network configured to use the first frequency comparison data and second frequency comparison data to adjust a remote frequency source of the base transceiver station, wherein the remote frequency source is used for communications with a mobile wireless communications device, wherein the second frequency comparison data is a result of comparing a signal derived from the remote frequency source and second AC mains information from a second AC mains sampler of the base transceiver station, wherein the first AC mains information and the second AC mains information include respective frequency deviations that are correlated in time.

24. The method according to claim 23, wherein the reference frequency source of the base station controller includes one or more of the following: a standalone atomic clock, a GPS disciplined oscillator, and other common sources of high accuracy and stability time references.

25. The method according to claim 23, wherein the base transceiver station comprises a plurality of base transceiver stations that are communicatively coupled to an aggregation any through a packet data network, wherein the aggregation any is communicatively coupled to the base station controller over a single base station controller port and a dedicated line, and wherein the aggregation gateway presents the plurality of base transceiver stations as a single logical base transceiver station to the base station controller.

26. The method according to claim 23, comprising adjusting frequency stability or accuracy of the remote frequency source of the base transceiver station based on a comparison of the first frequency comparison data and the second frequency comparison data.

27. The method according to claim 23, wherein the frequency comparison data includes a first frequency value from the first AC mains information and a second frequency value from the comparison signal.

28. The method according to claim 23, wherein the first AC mains information is associated with a frequency that is maintained within a tolerance across a distribution area, and wherein the base station controller and the base transceiver station are within the distribution area.

29. The method according to claim 23, wherein the the base station controller comprises a first comparator that compares the first AC mains information from the first AC mains sampler and the comparison signal generated using the reference frequency source to generate the first frequency comparison data, wherein the base transceiver station comprises a second comparator and a third comparator, wherein the second comparator of the base transceiver station compares the signal derived from the remote frequency source and the second AC mains information from the second AC mains sampler to generate the second frequency comparison data, and wherein the third comparator of the base transceiver station compares the first frequency comparison data and the second frequency comparison data to generate a tuning signal to tune the remote frequency source of the base transceiver station.

30. The method according to claim 23, wherein the remote frequency source is used to mix radio signals.

31. A base station in a mobile communications network, comprising:

a communication interface configured to receive first frequency comparison data from a base station controller via a packet data network, the base station controller comprising a first frequency source and a first AC mains sampler, the first frequency comparison data comparing a first frequency of the first frequency source and a second frequency from the first AC mains sampler; and a processor configured to compare a second frequency comparison data and the received first frequency comparison data and to adjust a second frequency source in the base station based, at least in part, on a result of the comparison of the second frequency comparison data and the received first frequency comparison data, wherein the second frequency comparison data compares a third frequency using the second frequency source and a fourth frequency of a second AC mains sampler, and wherein adjusting includes aligning the third frequency of the second frequency source to the first frequency of the first frequency source associated with the received first frequency comparison data.

32. A base station controller in a mobile communications network, comprising:

a processor configured to determine frequency comparison data by comparing first AC mains information from a first AC mains sampler of the base station controller and a comparison signal generated using a reference frequency source of the base station controller; and a communication interface configured to provide the first frequency comparison data to a base transceiver station of a GSM or UMTS mobile communications network configured to use the first frequency comparison data and second frequency comparison data to adjust a remote frequency source of the base transceiver station, wherein the remote frequency source is used for communications with a mobile wireless communications device, wherein the second frequency comparison data is a result of comparing a signal derived from the remote frequency source and second AC mains information from a second AC mains sampler of the base transceiver station, and wherein the first AC mains information and the second AC mains information include respective frequency deviations that are correlated in time.

33. A computer program product for adjusting a local frequency source, the computer program product being embodied in a non-transitory computer readable medium and comprising computer instructions for:

receiving first frequency comparison data at a base station from a base station controller or an aggregation gateway via a packet data network, the base station controller or the aggregation gateway comprising a first frequency source and a first AC mains sampler, the first frequency comparison data comparing a first frequency of the first frequency source and a second frequency from the first AC mains sampler;

comparing, at the base station, a second frequency comparison data and the received first frequency comparison data, the second device comprising a second frequency source and a second AC mains sampler, the second frequency comparison data being generated from comparing a third frequency of the second frequency source and a fourth frequency of a second AC mains sampler reflects a comparison between a locally obtained AC information and a signal generated using the local frequency source; and adjusting the third frequency of the second frequency source based, at least in part, on the comparison of the second frequency comparison data and the received first frequency comparison data, wherein adjusting includes aligning the third frequency of the second frequency source to the first frequency of the first frequency source associated with the received first frequency comparison data.

34. A computer program product for providing a frequency reference, the computer program product being embodied in a non-transitory computer readable medium and comprising computer instructions for:

determining, in a base station controller, first frequency comparison data by comparing first AC mains information from a first AC mains sampler of the base station controller and a comparison signal generated using a reference frequency source of the base station controller; and providing the first frequency comparison data to a base transceiver station of a GSM or UMTS mobile communications network configured to use the first frequency comparison data and second frequency comparison data to adjust a remote frequency source of the base transceiver station, wherein the remote frequency source is used for communications with a mobile wireless communications device, wherein the second frequency comparison data is a result of comparing a signal derived from the remote frequency source and second AC mains information from a second AC mains sampler of the base transceiver station, and wherein the first AC mains information and the second AC mains information include respective frequency deviations that are correlated in time.

35. The method according to claim 1, wherein a first phase of the first frequency source and a second phase of the first AC mains sampler are aligned before the first frequency and the second frequency are compared.

36. The computer program product according to claim 33, wherein the computer program product comprises computer instructions for determining whether first frequency deviations across time measured at the base station associated with the second comparison data correlate with frequency deviations across time measured at the base station controller or the aggregation gateway associated with the received first frequency comparison data.

* * * * *

UNITED STATES PATENT AND TRADEMARK OFFICE
CERTIFICATE OF CORRECTION

| | | |
|---|---|---|
| PATENT NO. | : 7,920,663 B1 | Page 1 of 1 |
| APPLICATION NO. | : 11/603323 | |
| DATED | : April 5, 2011 | |
| INVENTOR(S) | : Stevens | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 772 days.

Signed and Sealed this
Twenty-sixth Day of July, 2011

David J. Kappos
*Director of the United States Patent and Trademark Office*

UNITED STATES PATENT AND TRADEMARK OFFICE
CERTIFICATE OF CORRECTION

PATENT NO. : 7,920,663 B1  Page 1 of 1
APPLICATION NO. : 11/603323
DATED : April 5, 2011
INVENTOR(S) : William M. Stevens It is certified that error appears in the above-identified patent and that said Letters Patent is hereby corrected as shown below:

Column 11, line 28 delete "any through a packet data network," and insert --gateway through a packet data network,--.

Column 11, line 29 delete "any is communicatively coupled," and insert --gateway is communicatively coupled,--.

Signed and Sealed this
Third Day of January, 2012

David J. Kappos
*Director of the United States Patent and Trademark Office*